United States Patent [19]

Hayes et al.

[11] Patent Number: 4,667,308
[45] Date of Patent: May 19, 1987

[54] MULTI-DIMENSIONAL-ACCESS MEMORY SYSTEM WITH COMBINED DATA ROTATION AND MULTIPLEXING

[75] Inventors: David Hayes, Hertfordshire; Francis E. Rix, London, both of England

[73] Assignee: Marconi Avionics Limited, England

[21] Appl. No.: 596,456

[22] PCT Filed: Jul. 21, 1983

[86] PCT No.: PCT/GB83/00178
§ 371 Date: Mar. 16, 1984
§ 102(e) Date: Mar. 16, 1984

[87] PCT Pub. No.: WO84/00629
PCT Pub. Date: Feb. 16, 1984

[30] Foreign Application Priority Data
Jul. 21, 1983 [GB] United Kingdom ............... 8319704

[51] Int. Cl.[4] .................. G06F 12/00; G06F 12/06
[52] U.S. Cl. .................. 364/900; 365/189; 364/727
[58] Field of Search ... 364/200 MS File, 900 MS File, 364/515, 518; 365/189, 220, 130; 340/727

[56] References Cited

U.S. PATENT DOCUMENTS

| | | | |
|---|---|---|---|
| 3,800,289 | 3/1974 | Batcher | 364/200 |
| 3,812,467 | 5/1974 | Batcher | 364/900 |
| 3,984,811 | 10/1976 | Nyssens et al. | 364/900 |
| 4,163,281 | 7/1979 | Stringa | 364/200 |
| 4,187,551 | 2/1980 | Nutter et al. | 364/900 |
| 4,394,642 | 7/1983 | Currie et al. | 340/347 DD |
| 4,566,002 | 1/1986 | Miura | 340/727 |

FOREIGN PATENT DOCUMENTS

| | | |
|---|---|---|
| 1156380 | 6/1969 | United Kingdom . |
| 1504602 | 3/1978 | United Kingdom . |
| 1547942 | 7/1979 | United Kingdom . |
| 1560157 | 1/1980 | United Kingdom . |

OTHER PUBLICATIONS

C. D. Coleman et al, Bank of Memories System for Multiword Access, IBM Technical Disclosure Bulletin, vol. 9, No. 9, Feb. 1967.
A. Weinberger, Multiword Multidirectional Random Access Memory System, IBM Technical Disclosure Bulletin, vol. 10, No. 7, Dec. 1967.

Primary Examiner—Archie E. Williams, Jr.
Attorney, Agent, or Firm—Kirschstein, Kirschstein, Ottinger & Israel

[57] ABSTRACT

A data memory arrangement includes n columns of storage elements each column being addressable only one element at a time and having at least $n^2$ storage elements so as to provide a succession of square arrays. Each square array comprises square sub-sections. On storage of a complementary array of data the data is multiplexed from each square array to the next within each sub-section and after each cycle of such multiplexing the sub-sections are rotated one step cyclically. Such rearrangement of data gives freedom and speed of simultaneous access to data words occurring in original rows and/or columns without excessive penalty in the complexity of the addressing system.

6 Claims, 19 Drawing Figures

Fig. 11.

| RAM ADDRESS | Conditional value of $\Sigma_{3-0} - R_r$ | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 0 |
| $R_r A_0$ | 1 | 0 | 1 | 0 | 1 | 0 | 1 | 0 | 1 | 0 | 1 | 0 | 1 | 0 | 1 | 0 |
| $R_r A_1$ | 1 | 1 | 0 | 0 | 1 | 1 | 0 | 0 | 1 | 1 | 0 | 0 | 1 | 1 | 0 | 0 |
| $R_r A_2$ | 1 | 1 | 1 | 1 | 0 | 0 | 0 | 0 | 1 | 1 | 1 | 1 | 0 | 0 | 0 | 0 |
| $R_r A_3$ | 1 | 1 | 1 | 1 | 1 | 1 | 1 | 1 | 0 | 0 | 0 | 0 | 0 | 0 | 0 | 0 |

← PATTERN REPETITION BOUNDARY $\Sigma_{3-0}$ = SUMMATION OF SUB-SECTION ADDRESSES $(A_{7-4}) + (A_{3-0})$ $R_r$ = RAM/BIT NUMBER $R_r A_{3-0}$ = MODIFIED ADDRESS BITS 3-0 FOR RAM DEVICE FOR DATA BIT $_r$

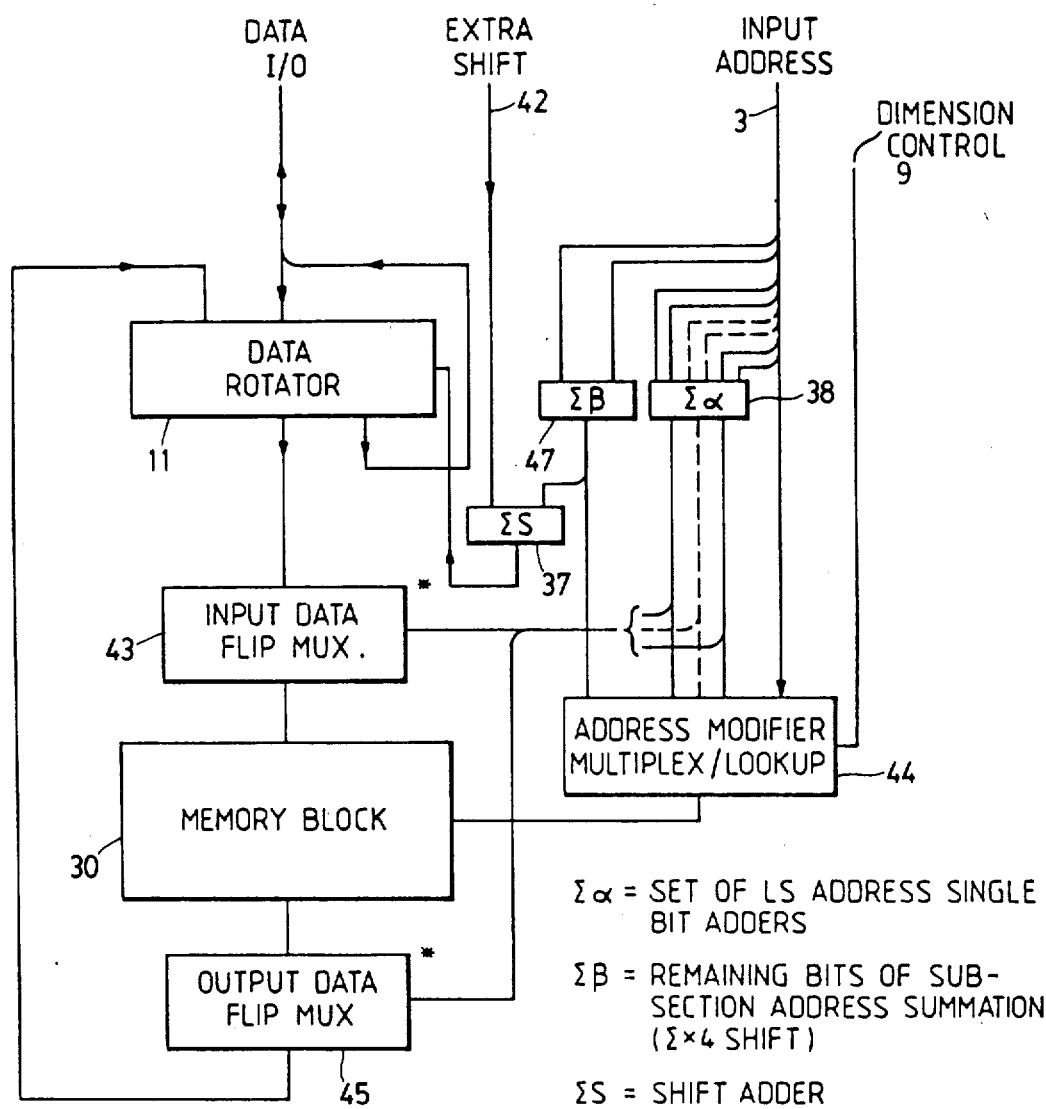

MULTI-DIMENSIONAL-ACCESS MEMORY SYSTEM WITH COMBINED DATA ROTATION AND MULTIPLEXING

BACKGROUND OF THE INVENTION

1. Field of the Invention

This invention relates to a memory arrangement for data storage and retrieval, that permits words (n bits of information) to be accessed (stored or retrieved) in a variety of different modes.

2. Description of Related Art

Conventiotally, data is stored in digital integrated circuits as contiguous words, each word having a single unique address. In certain applications it is required to access data from common bit locations of different, but regularly spaced words (e.g. the 5th bit of every 16th word). Normally this would be achieved by a masking operation carried out by a processor connected to the memory, but this is highly inefficient in terms of data retrieval, since it requires 'n' memory accesses to read (or write) n bits of data, together with the necessary address generation and masking operations to be carried out by the attached processor.

SUMMARY OF THE INVENTION

It is an object of this invention to provide a data storage/retrieval system in which this inefficiency is at least partly overcome, and in the preferred, general, case, to provide that 'n' bits of data can be accessed simultaneously from the rth bit location of a selected set of n words, spaced by $n^{m-1}$ (where the mode "m" is greater than or equal to '0'. When m=0, words are accessed in the conventional manner). Thus, in the three dimensional case, data can be thought of as being arranged in cubic $n \times n \times n$ data arrays, such that any row (x word, mode=0) or any column (y word, mode=1) or any z word (mode=2), may be addressed in the normal manner, together with a mode instruction, (there being $n^2$ x words, $n^2$ y words and $n^2$ z words in each such cube).

According to the present invention, a data memory arrangement includes a square array of storage elements arranged in rows and columns, each column being addressable one storage element at a time, means for storing data in the memory arrangement so that data bits of originally the same bit position in respective row data words are stored exclusively in different columns, and means for accessing simultaneously the bits of a selected data word distributed over the columns of the array.

The arrangement preferably comprises a plurality of square arrays, corresponding columns of which are addressable as single columns, one storage element at a time, and means for addressing simultaneously a selected storage element in each such column in a plurality of modes such that the accessed data word comprises an original row data word, an original column data word of adjacent data bits or a data word comprising periodically spaced data bits of an original column.

There may be included rotation means effective on storage of an array of data bits in a square array to displace the row data words with respect to their bit positions progressively and cyclically from each row to the next.

Where such a memory arrangement comprises n storage elements in each row and $n^{d-1}$ storage elements in each column, d being a dimension integer greater than two, within each block of n adjacent square arrays the rotation means may be arranged to displace the whole of the data to be stored in each square array by one row bit position progressively from each square array to the next to provide a third dimension access to data words the bits of which lay in corresponding locations in successive square arrays of the original data array.

The rotation means may be arranged to displace the whole of the data to be stored in each sub-array of $n^m$ storage elements, where $3<m<d$, by one row bit position progressively from each such sub-array to the next to provide (m+1)th dimension access to data words the bits of which lay in corresponding locations in successive said sub-arrays of the original data array.

In an alternative embodiment there may be included multiplexing means effective on storage of an array of data bits of word length n, where n is a power of 2, in a square array of $n^2$ storage elements, to rearrange the bit positions of successive row words in such manner that, if each row word is considered in single bits, pairs of said single bits, quadruple groups comprising said pairs, etc, then the single bits within each pair, the pairs within each quadruple group, the quadruple groups within an octal group, etc, are interchanged or not in any particular row in accordance with the digits of the binary numbers from 0 to n−1 attributed to the rows, the least significant digit indicating the interchange of single bits, the next least significant digit the interchange of pairs of bits, and so on.

Where there are $n^{d-1}$ storage elements in each column, d being a dimension integer greater than two, within each block of n adjacent square arrays, the multiplexing means maybe effective on storage of a data array of $n^{d-1}$, n-bit words to rearrange the order of the row words in each square array in such manner that, if each square array is considered in single rows, pairs of said single rows, quadruple groups comprising said pairs, etc, then the single rows within each pair, the pairs within each quadruple group, the quadruple groups within an octal group, etc, are interchanged or not in each square array in accordance with the digits of the binary numbers from 0 to n−1 attributed to the square arrays respectively, the least significant digit indicating the interchange of single rows, the next least significant digit the interchange of pairs of rows, and so on.

The arrangement may comprise data multiplexing and rotation means effective on storage of an array of data bits in a square array to rearrange the data array by a combination of cyclic rotation of groups of data bits and interchange of groups of data bits.

Where there are $n^{d-1}$ storage elements in each column, d being a dimension integer greater than two, the data multiplexing and rotation means may be effective to rearrange the data array on storage such that square sub-sections of a square data array are multiplexed within each sub-section, the sub-sections are subjected to progressive cyclic rotation, and successive ones of the square arrays are subjected to multiplexing and progressive rotation alternately.

In addition to the above general rearrangement of data, the rotation means may be effective in response to a rotation control signal to impose a further rotation on the data of any accessed word.

Again, address modification means may be effective in response to a boundary shift control signal to modify the address of a word in a dimension (d−1) in such manner as to access a word which extends across a boundary between adjacent $n^{d-1}$ arrays in an overall $n^d$ array.

It may be seen that a memory arrangement according to the present invention may, in a preferred embodiment, be seen as a multi-dimensional memory comprising a rectangular array of memory or storage elements arranged in rows and columns, there being n storage elements in each row. The whole memory comprises a number of square arrays each having a capacity of n words (row, or 'x' words) each word of n data bits.

The rows may be seen to constitute a first dimension, and the columns within a square array a second dimension. If the word length is maintained at n bits, a third dimension may be seen to lie in words which have one bit in each adjacent one of n square arrays in a corresponding position in the square array. Thus a third dimension word may comprise the 5th bit of the 2nd row word in each of n consecutive square arrays. A three-dimensional array would thus comprise n square arrays (or layers), each of $n^2$ elements. A three-dimensional array thus comprises $n^3$ elements and may be considered as a cube.

The concept of further dimensions in a physically two-dimensional rectangular array may be extended by consideration of one storage element in one $n^2$ layer and corresponding storage elements in $n^2$ layers spaced at intervals of n layers, i.e. one element in each of n successive three-dimensional 'cubes'.

Similarly, a d-dimension word is provided by consideration of an array totalling $n^d$ elements, consisting of n arrays each of $n^{d-1}$ elements the accessed d-dimension word comprising one bit from each of the n arrays.

It will be appreciated that in the above consideration of multi-dimensional memories, the accessed words of concern, of all but the first. dimension (the row, or 'x' word), fall exclusively in the same overall column and thus are conventionally accessible only in n separate access processes.

The present invention resolves this difficulty by rearrangement on storage of an original data array so that, irrespective of the dimension of the accessed word, the bits of the word fall exclusively in different columns.

There are two broad approaches to such rearrangement; (a) by rotation of data words and (b) by a form of multiplexing or permuting of data words.

In the general case, multi-dimensional access of a memory array of the kind referred to can be achieved by sympathetically modifying the order in which bits of data are stored and the manner in which the memory cells are addressed, as a function of both the given address and the mode instruction. In the two-dimensional case, for example, where the memory cells are arranged in square, n×n arrays and means are provided for separately addressing each column of the arrays (so that a row data word is addressable by a common address applied to each column), means are provided for storing row data words in a mutually displaced relation (so that data bits of originally the same bit position in a data word occur exclusively in different columns). This arrangement is then such that a column of data bits of originally the same bit position can be addressed simultaneously by appropriately modified row addresses applied to the separate columns of the memory array.

One method mentioned above for storing row data words in a mutually displaced relation is that of progressive and cyclic rotation with respect to their bit positions and address prior to storage in the array. The rotation means is then operable under the control of the mode and the address and is also such that the opposite rotation, (to that applied on storage) is applied on retrieval of a data word.

The multi-dimensional memory so arranged for simultaneous access can be indefinitely extended by progressively and cyclically rotating each $n^d$ array (which, if d is greater than 3, can be seen as a 'd' dimensional hypercube), and appropriately modifying the separate memory column addresses to access the n bit word in the mode demanded. For example, an $n^4$ array consists of n, $n^3$ arrays, with each $n^3$ array having an extra 1 bit rotation imposed on it, than the one before it, so that the first row word of the first $n^3$ array has no rotation, the first row word of the second $n^3$ array has a single bit rotation, the first row word of the third $n^3$ array has a two bit rotation, and so on until the first row word of the nth $n^3$ array has an $(n-1)$ bit rotation. This allows a single bit to be accessed for each of the n, $n^3$ arrays to form a word that would have been constituted by every $n^3$th bit in the same column of the memory array had no rotation taken place and hence would have been inaccessible in a single memory cycle.

In summary, it is emphasized that the multi-dimensional access memory is understood in terms of both its conceptual function and its actual operation. Conceptually, for an $n^d$ data array, $n^{d-1}$ words are addressable in "d" different modes, which for the first three modes (0, 1, 2) may be equated geometrically to the x, y and z dimensions, after which it is easier to think in terms of accessing words composed from single bits, in the same column, of row words occurring every $n^{d-2}$ rows. In contrast, the actual operation, involves the distribution of an $n^d$ data array across n×$n^{d-1}$ memory cells in such a way that words are, for example, progressively and cyclically rotated (one of many possible permutations) so that either common or modified addresses may be applied to the n columns of physical memory to access the data words in the mode demanded.

Two optional extensions to the multi-dimensional access memory are also considered, since they further utilise means for data rotation and address modification where these exist esentially. The first is that of applying an extra rotation to the data retrieved from memory under external control of a bit rotation control word. The second is that of applying an offset to the address, so that the highest dimensional words (mode=d−1) can be accessed across the boundaries of an $n^d$ data array, under external control of a boundary shift control word. Both extensions help reduce the computational load on any external data processor to which the multi-dimensional access memory can be attached, and this leads to more efficient computation. However in performing the boundary shift one restricts the boundary shift to the highest dimension, (since the added rotation of consecutive lower order arrays required for accessing the lower dimensions leads to conflicting requirements in terms of bit addressing).

BRIEF DESCRIPTION OF THE DRAWINGS

Several embodiments of the multi-dimensional access memory in accordance with the invention will now be described, by way of example, with reference to the accompanying drawings, of which

FIG. 11 presents an example of the basic modification pattern used in a 16-bit full-rotate-format MDAM:

and FIG. 15 shows a schematic diagram of an implementation of a partial rotate-partial multiplex MDAM.

DETAILED DESCRIPTION OF THE PREFERRED EMBODIMENTS

Figure 1:
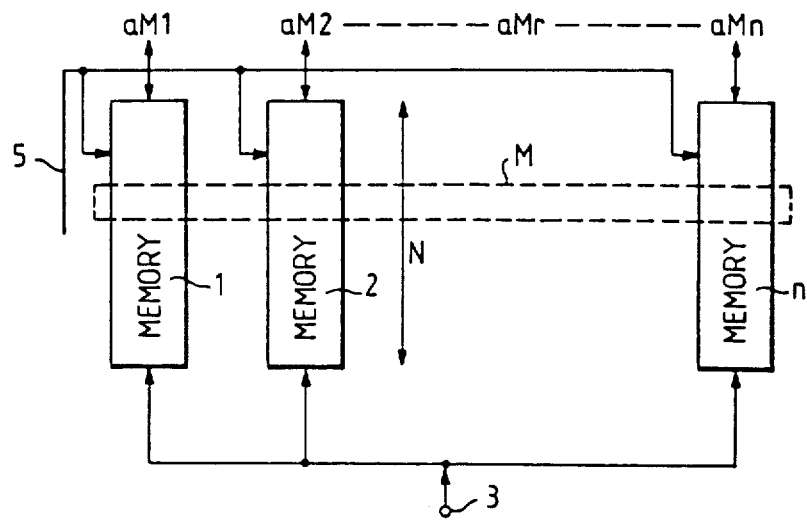
FIG. 1 is a block diagram of a conventional single dimensional access memory.

Referring now to FIG. 1, this shows a conventional single dimensional access memory in which n memories 1, 2, 3 . . . n, each 1 bit wide by N bits long, are addressed by a common address line 3. Thus an n bit data word can be accommodated in any row of the n×N memory array, the complete row word is identified and addressed by number index (M) of the storage element employed in each 1×N memory array. The diagram shows a particular row 'M' being addressed. Each element ('a') of the data in the n×N memory data array is identified by the number of the element within the column ('M') and the number of the column ('r'). Since the address of each element of the selected row is the same ('M'), a common address line 3 is used. A common control line 5 determines whether the memory access process is one of storage (a 'write') or one of retrieval (a 'read'). The data elements map directly (isomorphically) into the memory storage elements.

Clearly, a data word can be extracted from any row at will, but because of the selective nature of the addressing facility within each memory array, i.e. the ability to select one, and only one, memory element within a column, which facility is inherent in conventional memory arrays, a column data word cannot be read in a single step.

Figure 2:
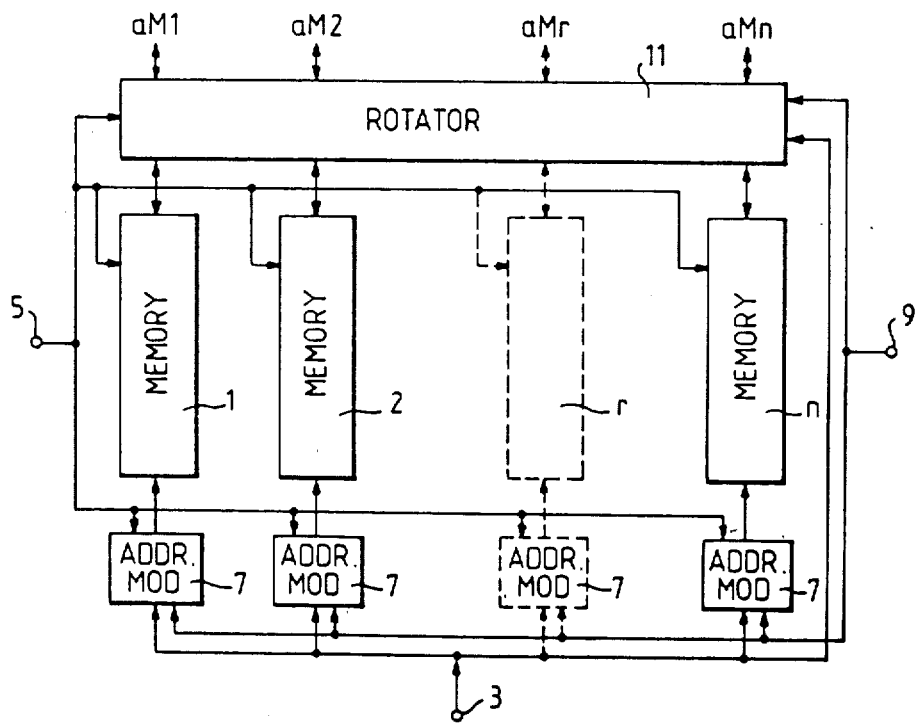
FIG. 2 is a block diagram of a two-dimensional access memory.

One embodiment of the invention which overcomes this difficulty is shown in FIG. 2. The 1×N memory arrays 1 to n are similar to those of FIG. 1 and are also addressed only on a selective basis. However in this case the individual addresses can be applied in common, to address a particular row 'M', as before, or, under the control of address modifiers 7 can be directed to progressively different (i.e. staggered) locations in each column.

Two control inputs are now required: the read/write control input 5 as before, to control 'read' or 'write' and an additional row/column, or mode control input 9 to determine a 'row' or 'column' mode.

Figure 3:
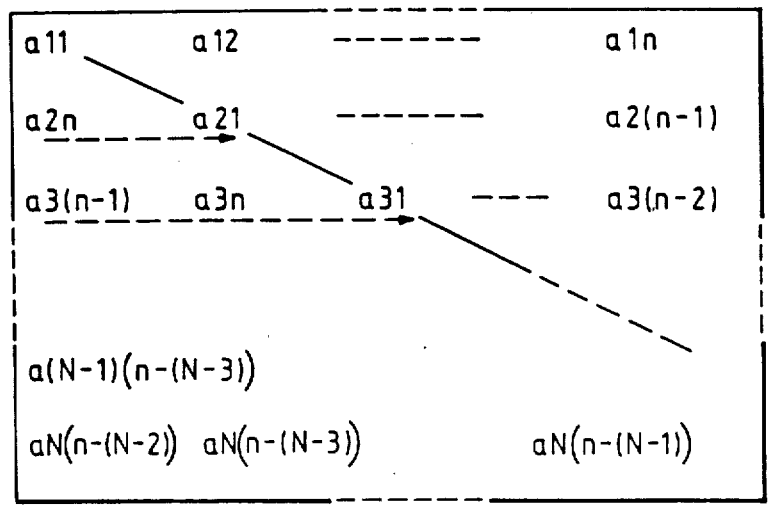
FIG. 3 illustrates the disposition of data stored in a two dimensional access memory in accordance with a rotational data rearrangement.

In operating this arrangement the data is stored in a modified way. Data words which are supplied a row at a time, from an original rectangular data array, are displaced progressively and cyclically with respect to their bit positions as shown in FIG. 3. The first row word 'a11, a12, . . . a1n' is entered normally. The second row word 'a21, a22 . . . a2n' is shifted to the right cyclically ('rotated') so that the least significant bit of the word, 'a2n' occupies the most significant storage location. The remaining row words are rotated in a similar manner so that progressively the bits that would have occupied a single 1×N memory array now occupy the diagonal formation such as that shown. The essential feature is that data bits having originally the same bit position in the various row data words, occur, after the rearrangement, exclusively in different columns. Every original column data word of n bits is thus distributed over n columns and can be addressed in a single operation since each 1×N memory array contains only one bit of the original column word. It should be noted that the rows have been described as extending from 1 to n, left to right. It is more conventional to use a right-to-left increasing format but the principle is unaffected. Similarly, data displacement may equally be to the left.

It will be apparent that to achieve the above distribution of a column data word it is not essential to rotate successive row words systematically as described above. Any set of n mutually exclusive permutations (together with their n inverses) would be adequate; for example successive rotations may be multiples of one column or may even be random, as long as the condition is maintained that no column contains more than one of the original column bits and also that the permutations (e.g. rotations) are recorded so as to permit reversion (application of the inverse permutation) to the original format, as will be explained.

Figure 4A:
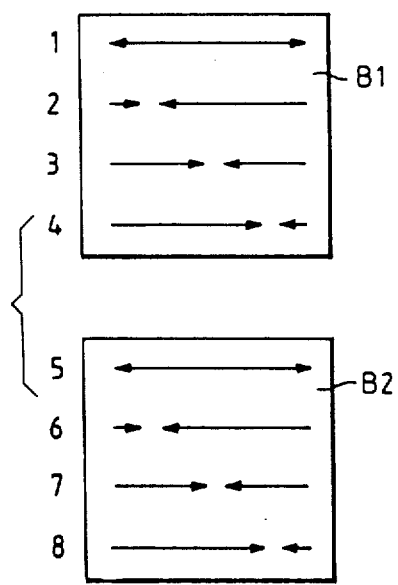
FIG. 4(a) and 4(b) are a diagrammatic illustration of the accessing of row and column data in the arrays of FIGS. 2 & 3.
Figure 4B:
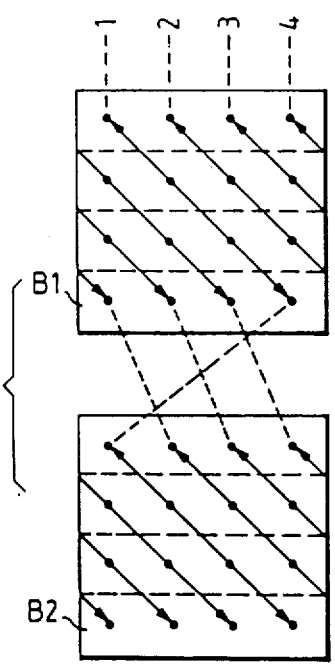

If the length of a 1×N memory array (a column of memory) is greater than the length of a data word (i.e. N>n) then a whole column cannot be distributed for simultaneous access. However, sub-columns, each the length of a row word (i.e. n bits long) can be addressed so that the whole column is accessed as a sequence of sub-columns—thus requiring N/n access operations. This is illustrated in FIGS. 4(a) and 4(b) which show respectively the layout of row data words and column data words when 8-bit column data words are stored after rotation in a 4-column array, i.e. N=8 and n=4. Each block of data, B1, B2, illustrated, comprises a square array, or layer, of rows and columns of four bits each (i.e. n=4), the number of blocks or layers depending upon the original column length and being typically many thousands for current technology integrated circuits (e.g. dynamic RAMs).

To return to FIG. 2, the above bit-position shift of row data words is performed on storage and retrieval by means of a 'barrel shifter' or 'rotator' circuit 11. On data storage into the memory array a row word of n bits is supplied to the rotator 11 in parallel and, under the control of the address line 3, a cyclic shift to the right is effected to an extent dependent on the address of the row. A row word to be stored in the 5th row is given a shift of four bit positions and so on, in accordance with the scheme depicted in FIG. 3.

The read/write control input 5 and mode control input 9 operate as follows. The read/write input 5 is connected to the individual memory arrays 1 to n to effect read-out write-in in the usual way. It is also connected to the rotator 11, to determine a rightwards shift on a 'write' instruction and a leftwards shift on a 'read' instruction. The mode control input 9 is connected to the rotator 11 to enable rotation according to a row or a column instruction. It is also connected to each of the address modifiers 7 to enable or inhibit address modification in correspondence with a column or a row instruction. In a storage operation for a row data word, the read/write control input 5 applies a 'write' signal to the rotator 11, dictating a rightwards shift. The mode control input 9 applies a 'row' signal so producing no address modification. The address input 3 applies the row address, i.e. 'M', to the (now ineffective) modifiers 7, and also to the rotator 11 to determine the extent of the left/right shift that the rotator imposes. The row data word is thus entered into the array with a bit-position determined by the rotator and into the row having address 'M' specified by the address input 3.

In a retrieval, or 'read', operation to extract a row word in its original form, the control input 5 applies a 'read' signal to the rotator 11 to effect a leftwards shift. Again the mode control input 9 applies a 'row' signal which produces no address modification by the modifier 7, and the address input 3 specifies row address 'M' and controls the extent of the leftwards shift of the rotator 11.

The retrieval operation is thus the inverse of the storage operation and the originally stored row word is reproduced with the original, undisplaced, bit positions. There is, of course, no particular merit in this form of row-word retrieval, it is merely necessary as a result of the bit-shifted storage process.

However, if a column word is required to be retrieved from the original array of row words (as the array would have been without bit-position shifting) the process is as follows ( a column word being a word comprising the data from the same bit position 'r' in all the original row words). A column address (r) is applied to address input 3, a 'column' instruction to mode input 9 and a 'read' instruction to 'read/write' control input 5. The address modifiers 7 operate on the applied address under the control of the 'column' instruction from the mode control input 9 to modify the address in such a way that successive $1 \times N$ memory arrays 1 to n receive successive row addresses starting with row 1 at memory array r, row 2 at array (r+1), row 3 at array (r+2), and so on cyclically to row n at array (r−1). A particular 'cyclic diagonal' is thus identified. Retrieval from these 'diagonal' locations then occurs and the data word is passed to the rotator 11 which, under control of the column address 3 applies the appropriate rotation to ensure that the bit from row 1 is in the least significant (LS) bit position. The required column data word is thus provided in its original and correct bit position at the output of the rotator 11.

Owing to the inherent symmetry of the design, it is also possible to store a column word, the process being as follows. A column data word is distributed over the parallel inputs of the rotator. A column address is applied to address input 3, a 'column' instruction to mode control input 9 and 'write' instructions to 'read/write' line 5. Each address modifier 7 operates on the applied column address under control of the 'column' instruction to modify the address in such a way that successive $1 \times N$ memory arrays 1 to n receive successive 'row' addresses thus identifying a particular 'cyclic diagonal'. Storage at these diagonal locations then occurs, the data word first being passed through the rotator 11 under the control of the address line 3 to apply appropriate rotation for the LS bit to be placed in the diagonal at row 1. The designated column data word is thus stored in the memory array in its defined 'cyclic diagonal' form.

The actual address modification is a simple modulo arithmetic operation (n.b. modulo arithmetic is sometimes termed 'clock arithmetic', because of its cyclic nature—e.g. 13 mod (12)=1, 6 mod (7)=2 etc). Such arithmetic can readily be implemented using electronic devices such as PROM (programmable read only memory) look-up tables or alternatively as modulo 'n' adders in programmable array logic (PAL).

In mathematical terms, a square $n \times n$ memory array, represented by n, $1 \times n$ memory arrays ($A_1 \ldots A_n$) is accessed in the column mode as:

$A_1 ((n-r) \mod(n))$, $A_2 ((n-r+1) \mod(n)) \ldots A_n (n-r+(N-1)) \mod(n)$ where 'r' is the column address ($0 \leq r < n$). For example, column 3 of a $4 \times 4$ memory array will be accessed as:

$A_1 ((4-3) \mod (4))$, $A_2 ((4-3+1) \mod (4)$, $A_3 (4-3+2) \mod (4)) A_4 ((4-3+) \mod(4))$ that is:

$A_1 (1)$, $A_2 (2)$, $A_3 (3)$, $A_4 (0)$ which may also be represented by the address modification "look-up" table shown below:

|  | 0 | 1 | 2 | 3 | memory/column number |
|---|---|---|---|---|---|
| original | 0 | 1 | 2 | 3 |  |
| column | 1 | 3 | 0 | 1 |  |
| address | 2 | 2 | 3 | 0 | accessed address |
|  | 3 | 1 | 2 | 3 | 0 |

When a rectangular, $n \times N$ memory array is used, where N=p.n, then the same address modification is used for the p, $n \times n$ square sub-arrays; each sub-array is indexed by (M−Mmod(n)), where M is the row address within an overall column ($0 \leq M < N$) and Mmod (n) is the row address within a column of a sub-array. If $n=2^s$, where s is an integer, then (M−Mmod(n)) is simply generated by taking the most significant bits above the s least significant bits.

By means of the above described modification permitting row and column read out, the conventional one-dimensional access memory of FIG. 1 has become a two-dimensional access memory in the sense that there are two ways in which data words can be selected from the memory, where each accessed data word is a simultaneous selection of data bits. In such a memory it may be seen that the additionally accessible data word is provided by 'rotating' the data in memory and then 'rotating' the addresses.

The access of data words from a memory having the form of a rectangular array of rows and columns may be extended into higher 'dimensions' than the above two-dimensional rows and columns. A dimension in this context of an array of original data 'n' bits wide and 'N' bits long, may be considered as a selection of data bit locations which form a repeatable pattern in the original array. The conventional 'dimension' is a row, i.e. one bit having the same row address in each column. A column is the next simplest selection and 'dimension' but this requires displacement in accordance with the invention, e.g. as in FIGS. 3 & 4 in order to overcome the difficulty that two bit locations in the same column cannot be accessed simultaneously.

Figure 6:
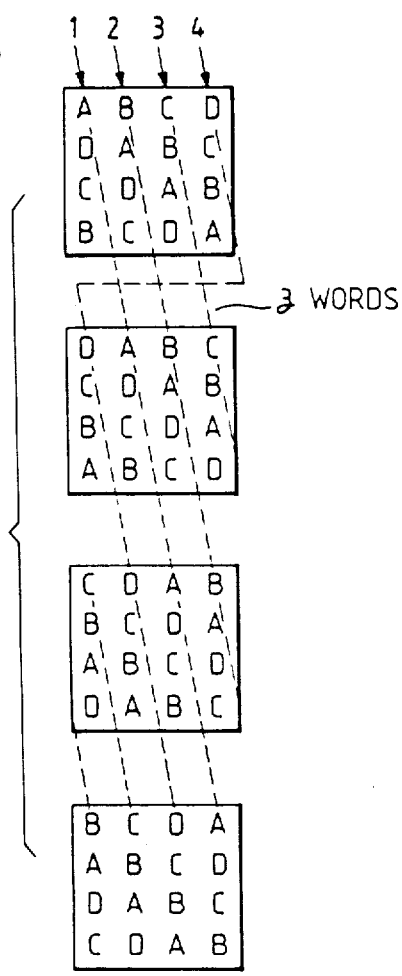
FIG. 6 is a diagram to illustrate rotational displacement of data in a three-dimensional access memory.

FIG. 6 illustrates a further 'dimension' which consists of every fourth bit location in a column of the original array, these selected bits being shifted according to the scheme of FIG. 6 to ensure that they do not fall in the same column.

The letters 'A' represent all the bits of the original first column of data prior to storage and bit rotation. The letters B, C & D similarly represent the original second, third and fourth columns. Clearly, in FIG. 6, a simple, cyclic, one-bit shift for every row would bring all the selected bits back into the same column and thus make the word inaccessible in a single operation.

Figure 5:
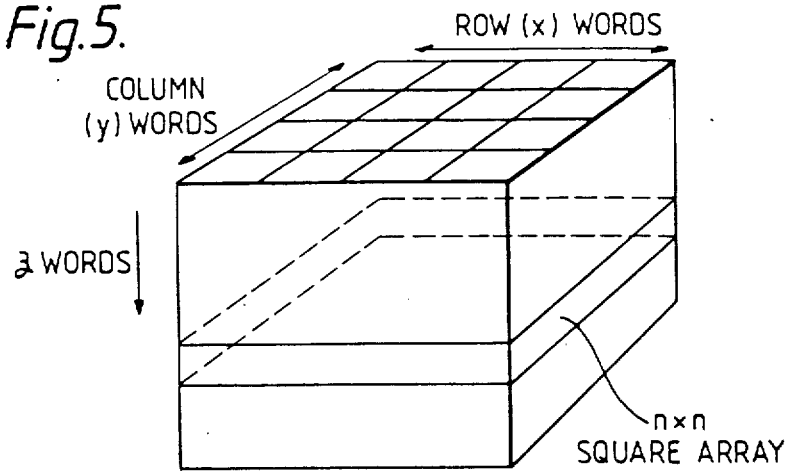
FIG. 5 is a conceptual representation of a three-dimensional data array.

The memory of FIG. 6 may be represented as an 'n'×'n'×'n' cube as shown in FIG. 5, in which case the selected word, of every fourth or rather, every nth bit, in an original column, may be seen as a 'z' word extending along a slant line (A A A A, from n×n layer to n×n layer) in a third dimension (the first and second dimensions being the rows and columns). Since the layer pattern repeats after every n layers, if the original column length, i.e. N bits, is greater than $n^2$, a data word comprising every nth bit of an original column cannot be accessed in one operation, but has to be accessed in groups each producing n bits.

It will be appreciated that the three-dimensional cube representation of FIG. 5 is purely an aid to understanding, the physical layout being in fact in the same form as for the two-dimensional access memory except that the address modification and rotation facilities are extended to work across 'n' square arrays i.e. over N rows.

The storage of data in accordance with FIG. 6 is achieved by progressively and cyclically commencing each n×n square array (n consecutive memory words) with an extra cyclic shift relative to the previous square array, as is shown in FIG. 6. In FIG. 6, for the sake of simplicity only a four bit system is illustrated, but it will be clear that in principle n can take any value, normally a power of two. In addressing a particular "z" word, the word address and the mode (=2) determines the required address modification—so that, starting with the memory element that contains the first bit of the selected "z" word and progressing cyclically the address modification units cause increments of size 'n' in the applied addresses.

The extent of address modification increases linearly with respect to corresponding increases in memory dimensions. That is, for simultaneous access of n data bits in any one of d dimensions where d<n and n=2, 4, 8, 16 etc, then $(d-1)\log_2(n)$ binary address lines need to be modified. Also, the number of binary control lines to define the access mode increases logarithmically and requires $\log_2(d)$ binary control lines to be included.

In regard to the two optional extensions (mentioned previously) of the invention. The extension to perform an added rotation on data read from (or written into) multi-dimensional access memory is implemented simply by employing a modulo adder to appropriately modify the rotation associated with a particular address and mode. The optional cyclic shift (rotation) therefore requires an extra: $\log_2(n)$ binary rotation control lines to be included.

Figure 7:
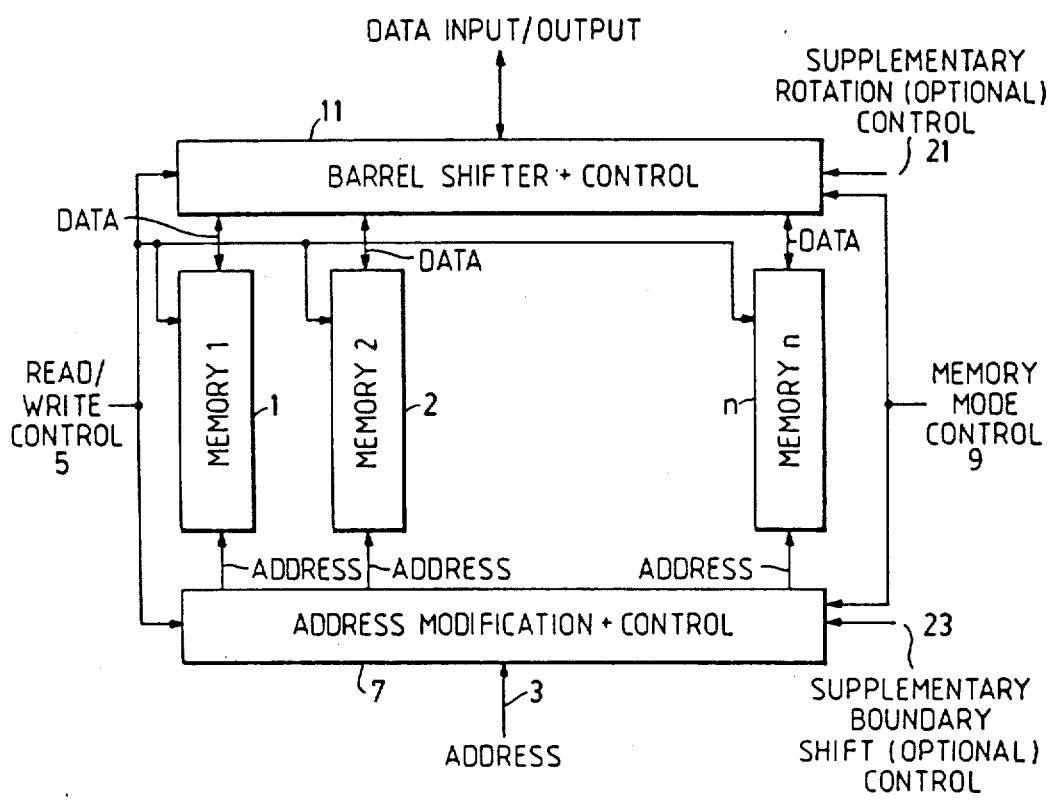
FIG. 7 illustrates a typical multi-dimensional access memory with optional added rotation and boundary change facilities.

The extension to perform a boundary shift on the highest dimension of the multi-dimensional access memory is implemented simply by employing more complex address modification circuitry that allows an address boundary to be straddled. In practice this requires control of the next most significant address line by means of either a PROM "look-up" table or PLA (programmable logic array) adder system, under the direct control of the boundary shift control word. The optional boundary shift therefore requires an extra $\log_2(n)$ binary boundary control lines (21, FIG. 7) to be included, if one assumes only forward shifts. Thus a typical multi-dimensional access memory will be configured as shown in FIG. 7, where the means for rotation (11) and address modification (7) have been extended to allow for supplementary rotations and boundary shifts.

FIGS. 8(a), 8(b), 8(c) and 8(d) show the progression multi-dimensional access memory from the conventional one-dimensional access memory to the four-dimensional access memory, the effects of the optional boundary shift also being illustrated.

Figure 8:
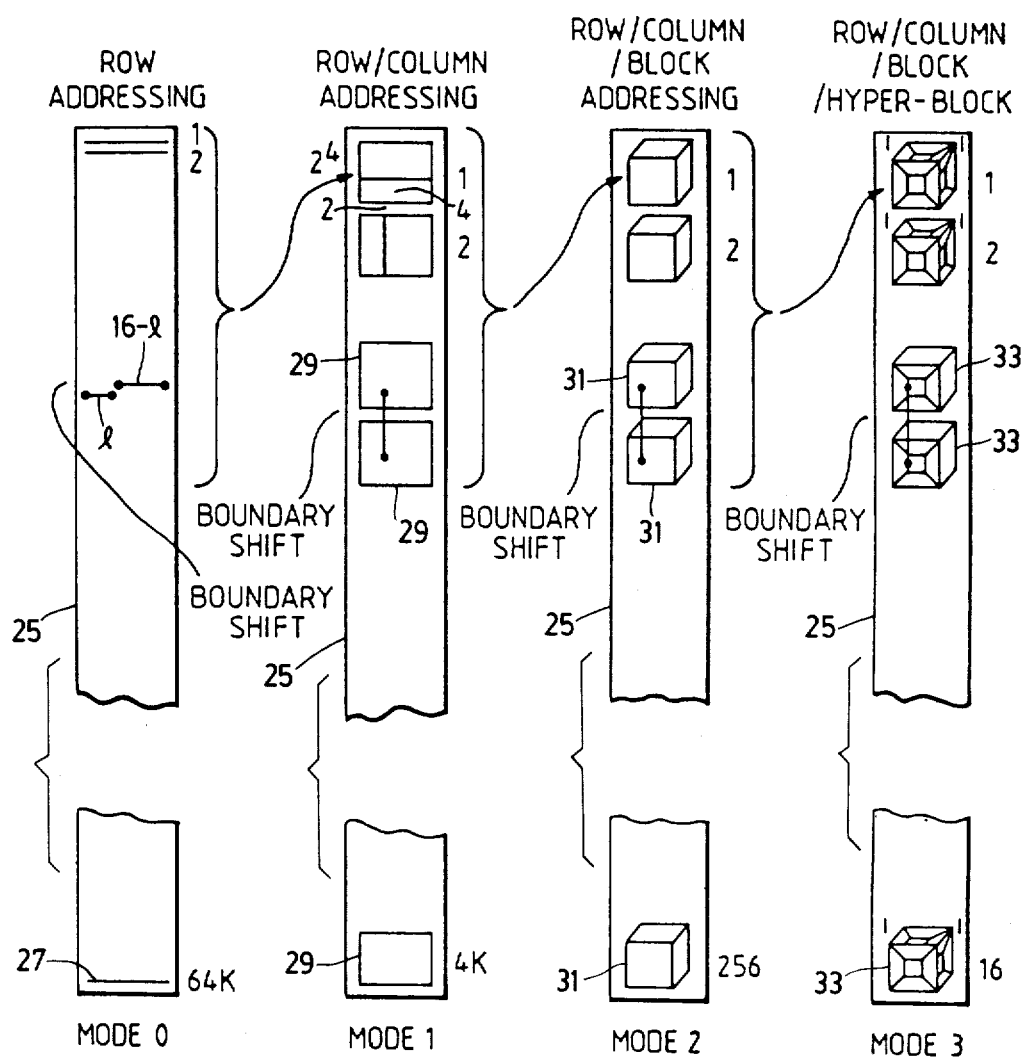
FIGS. 8(a), 8(b), 8(c) and 8(d) summarize the conceptual modes of access of a multi-dimensional memory.

In mode O (FIG. 8(a)) the store 25 is arranged as 64k, 16 bit row ('x') words, 16 binary address lines being required to access memory. The optional boundary shift (1) would under these one-dimensional circumstances, apply at the row bit level, so that the last 16-(1) bits of the addressed word would combine with the first 1 bits of the next consecutive word.

In mode 1 (FIG. 8(b)) the store 25 is arranged (conceptualised) as 4K, 16×16 data arrays 29 from which row (x) or column (y) words can be accessed, 17 binary address lines being required to distinguish any row or column address (assuming mode control to be included in the address). The optional boundary shift (1) would under these two-dimensional circumstances apply at the column bit level, so that the last 16-(1) bits of the addressed column word would combine with the first 1 bits of the column word in the next 16×16 array 29.

In mode 2 (FIG. 8(c)), the store is arranged (conceptualised) as 256, 16×16×16 data arrays 31 from which row (x) or column (y) or (z) words can be accessed, 18 binary address lines being required to distinguish an x, y or z address. The optional boundary shift (1) would under these three-dimenional circumstances apply at the z level, so that the last 16-(1) bits of the addressed z word would combine with the first '1' bits of the next consecutive z word in the next 16×16×16 array 31.

In mode 3 (FIG. 8(d)), the store is arranged (conceptualised) as 16, $16^4$ data arra which x, y, z or 'hyperblock' (h) words can be accessed, 18 binary addresses still being sufficient to distinguish any x, y, z or h words. The optional boundary shift now extends across consecutive hypercubes.

It may be seen that in order to effect a boundary shift, the accessed word must be of a dimension lower than the highest dimension available. Thus in an $n^3$ array the highest dimension word that can be accessed across a boundary is a second-dimension word.

It may be noted that from a user viewpoint, the labelling of dimensions (e.g. x, y, z etc) is largely arbitrary, but once chosen it is advisable to adhere rigidly to them in order that controlling software may be consistent.

The main application of the invention is in the performing of repetitive data manipulation tasks (in conjunction with a processor) which involve the movement of bits of data between or within words. For example suppose it is required to list, over a field of 1024 words, that the 7th the 5th and the 0th are all '1's' and to indicate this fact by setting the 15th bit to '1'. Conventionally this would require ANDing the entire 1024 words with the mask (0000000010100001) and then comparing (subtracting) the result with the mask, which, if the same, would result in the 15th bit of the original word being set. Employing an MDAM according to the invention however, the 7th, 5th and 0th bits could be "ANDed" together 16 a time in y-dimension (i.e. as column words) and the result written into the 15th bits in parallel in the same mode. Thus the former method would require a minimum of 1024 reads+considerable processing+an unknown number of writes (<1024), whereas the latter would take 192 reads+128 ANDs+64 writes. Clearly, the MDAM is many times more efficient and for a typical computer system this type of bit manipulation would result in a throughput improvement by a factor of at least 8.

Alternative data storage formats may be utilised, the applicability and efficiency of which are dependent upon memory speed, space and power constraints, and the requirements for extra shift and boundary straddling facilities.

In general, a simplification of the addressing function (i.e. a reduction in the total number of address lines) will result in a more complex or extended data path, and vice-versa.

The available data formats range from the fully progressive cyclic rotation mechanism described above, to a fully multiplexed structure, through any combination of rotation and multiplexing.

As a broad comparison the various formats can be summarised as follows:

The full rotation mechanism requires a large number of derived modified address lines, using a complex derivation structure. The data path must, by definition, contain a data rotator, which is then simply adapted for extra shift functions, with little timing penalty.

The fully multiplexed mechanism requires a minimum, simply derived set of modified address lines. If no extra shift function is required then the data path is a relatively simple set of multiplex stages. Extra shift functions necessitate a completely independent rotator, however, involving increased delay.

A combination of rotation and multiplexing may be utilised to give a data storage format which is a compromise, using a minimal to medium set of modified lines with minimal complication and delay in the data path, extra rotation inclusive.

Embodiments of these various data formatting techniques within an overall multidimensional access memory will now be described, with reference to FIGS. 9 to 15 of the accompanying drawings.

In the following consideration the input address, that is, the address of the required word in the original data array, is assumed to be in the form $A_x-A_o$(MS-LS), and will be arranged in sub-sections of decreasing significance left-to-right for selective manipulation for various dimensional access.

For first dimension access the whole input address is used directly as the normal physical address.

For second dimension access the least significant sub-section defines the required y word, the higher order sub-section pointing to the required $n^2$ layer.

For the third dimension access, the least significant sub-section defines the required physical (x word) location within each layer: the second least significant sub-section defines the required z word: and higher order sub-sections indicate the required block of n layers of $n^2$ words per block.

For fourth dimension access the LS and second LS sub-sections indicate the required physical (x word) location within the block of n layers. The third LS sub-section indicates the required fourth dimension word, while higher order sections point to the required set of blocks of layers.

The address function of the various sub-sections continues similarly for higher dimensions.

Figure 9:
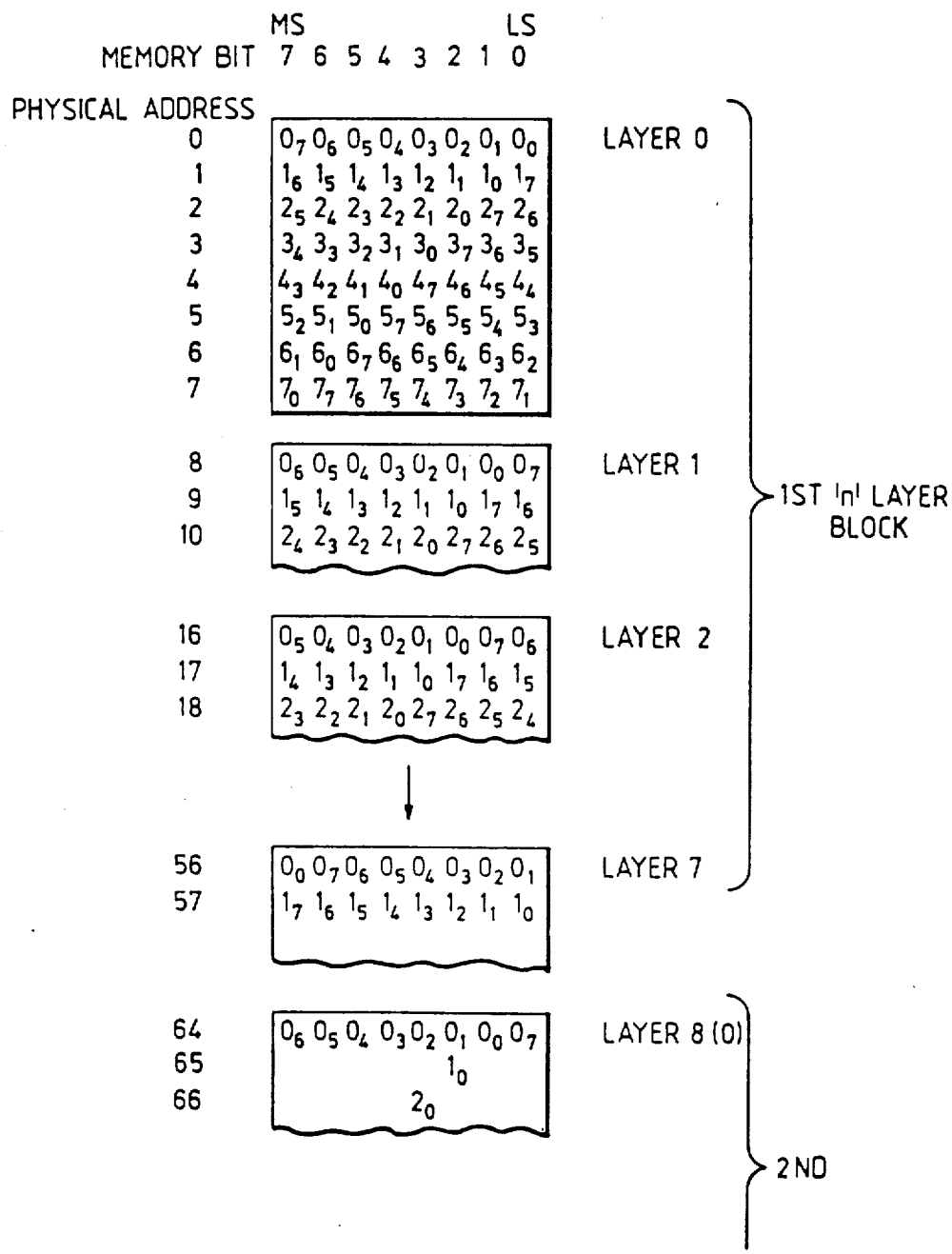
FIG. 9 shows an 8 bit (i.e. n=8) example of a fully rotated multidimensional access memory (MDAM) data format.
Figure 10:
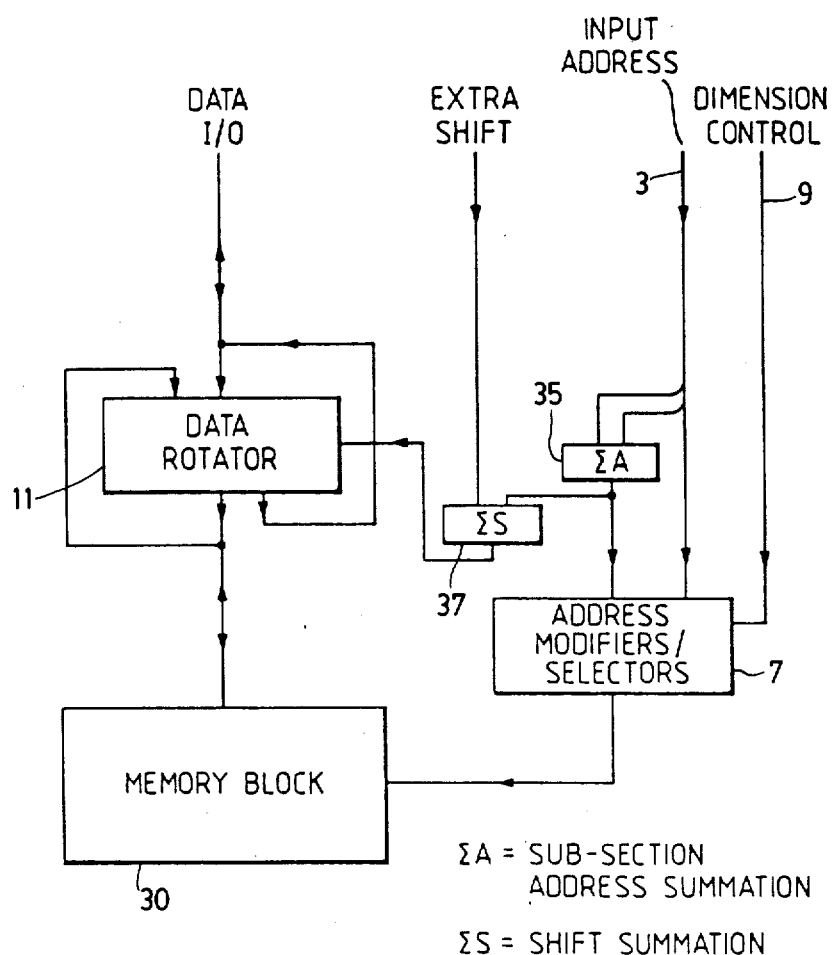
FIG. 10 shows a schematic diagram of an implementation of a full-rotate-format MDAM.

The fully rotated format illustrated by an 8-bit array in FIG. 9, utilises an additional one-bit shift for each successive word stored in physical memory (30, FIG. 10), together with a further additional shift being introduced at modulo 'n' intervals, i.e. between the layers, (where n is the word length). This format allows any first dimension word to be directly accessed (without address modification but with data rotation). Furthermore, with appropriate address modification and data rotation higher dimensional access is achieved. The second dimension is accessed by extracting the corresponding kth bit from each of n consecutive words, i.e. the successive bits in the kth column of the original array. The third dimension is accessed by extracting the kth bit from each of n row words spaced at n row word intervals. In general the mth dimension is accessed by extracting the kth bit from each of n row words spaced at $n^{(m-2)}$ intervals (except where m=1 which is 1st dimensional single word access). It is assumed here that access does not straddle a (modulo n)$^{m-1}$ word boundary e.g. second dimensional access is from a layer of words within a row word address boundary Ar, where: $n \times (x) < Ar < n \times (x+1)$ and x is an integer. A diagram of an MDAM arranged for a full rotation format is given in FIG. 10 in which components corresponding to those in earlier configurations are similarly referenced.

For an m dimensional memory of word length n, the addressing derivation is a function of the summation of (m−1) input address sections each of log (n) digits.

For example for a 16 bit three-dimensional memory two four-bit address sections $A_{7-4}$ and $A_{3-0}$ are required. Modified addressing may then be derived, in summation circuit 35 and modifier 7, as a function $f(\Sigma[(A_{7-4})+(A_{3-0}])$ i.e. the summation, ignoring overflow carry, of two 4-bit address sections. For simplicity this will be referred to as $f(\Sigma_{3-o})$, $\Sigma$ being a four-bit resultant.

The addressing mechanism is provided by a rotating binary pattern, which, for a fully rotated format, is shown in FIG. 11. The pattern may be considered as being stored in a 16 stage cycling shift register, each stage being tapped to provide a 4-bit address code to select a bit in a particular column as indicated above the address codes. The pattern is cycled to a phase position according to the number of the second dimension word to be accessed so that each 4-bit address accesses one bit of the word. Programmable logic circuitry is in fact used to achieve a similar result.

The pattern shown in FIG. 11 is required for a fully rotated data format but in the case of a multiplexed format some of the 4-bit addresses will be identical and an economy of address lines will result.

As may be seen from FIG. 11, the codes are the same for corresponding lines but have a progressively shifted origin according to bit position in the basic n bit word length. The address thus becomes a $f(\Sigma - R_r)$ where $\Sigma$ is the sub-section address summation, $R_r$ is the RAM, i.e. column or bit number in the range $0 \leq r < n-1$.

Thus for memory bit 0 (i.e. column 0, the LS bit) the origin (word 0) is at the right hand column of FIG. 11. Thus to address the first word in memory (2nd dimension), $\Sigma 3-0-R_o=0$ and the address pattern 0000 will be used. For the second word $\Sigma 1-0=1$ and the pattern is 1111; for the third word, $\Sigma 2-0=2$ and the pattern is 1110, and so on.

For memory device bit 1 (the next LS bit) the origin is shifted one place left. Thus to address the first word, $\Sigma 0-1-15$ and the pattern is 0001; to address the second word, $\Sigma 1-1=0$, pattern is 0000; and so on.

Similarly, for successive memory devices (i.e. columns) the origin is shifted r places left (where r is the bit number range $0-(n-1)$, the addresses being derived as a function of $(\Sigma - r)$.

Third dimensional access operates on the next sub-section of addresses in the same manner, the first sub-section reverting to normal addressing. Increasing dimensions operate on higher order sub-sections respectively. For first dimensional access there is no modification.

Data rotation in rotor 11 is also a simple derivative of the sub-section summation (35) being a $\Sigma$bit shift for a write operation or an $(n-\Sigma)$ bit shift for a read operation, and extra shift is easily included with an extra adder stage 37.

The number of modified address lines required rises exponentially with word length. Thus, $2A_0$ bits, $4A_1$ bits, $8A_2$ bits, and so on progressively, are required, up to n $A(\log n - 1)$ bits where n is word length. Higher order bits repeat this pattern for higher dimensional access.

For example, a 16 bit 3-D memory requires:

| 2 | $A_0$ | 4 | $A_1$ | 8 | $A_2$ | 16 | $A_3$ | |
|---|---|---|---|---|---|---|---|---|
| 2 | $A_4$ | 4 | $A_5$ | 8 | $A_6$ | 16 | $A_7$ | 60 modified lines |

The simplest, conceptually, implementation is an adder/lookup prom circuit, but complex multiplexing may be used for higher speed.

It is assumed above that the data rotator 11 uses uni-directional shift only. A bi-directional shifter could be used.

The direction of shift may be reversed with a corresponding change of the address patterns, and shift control. To the outside world the direction of shift is irrelevant.

Figure 12:
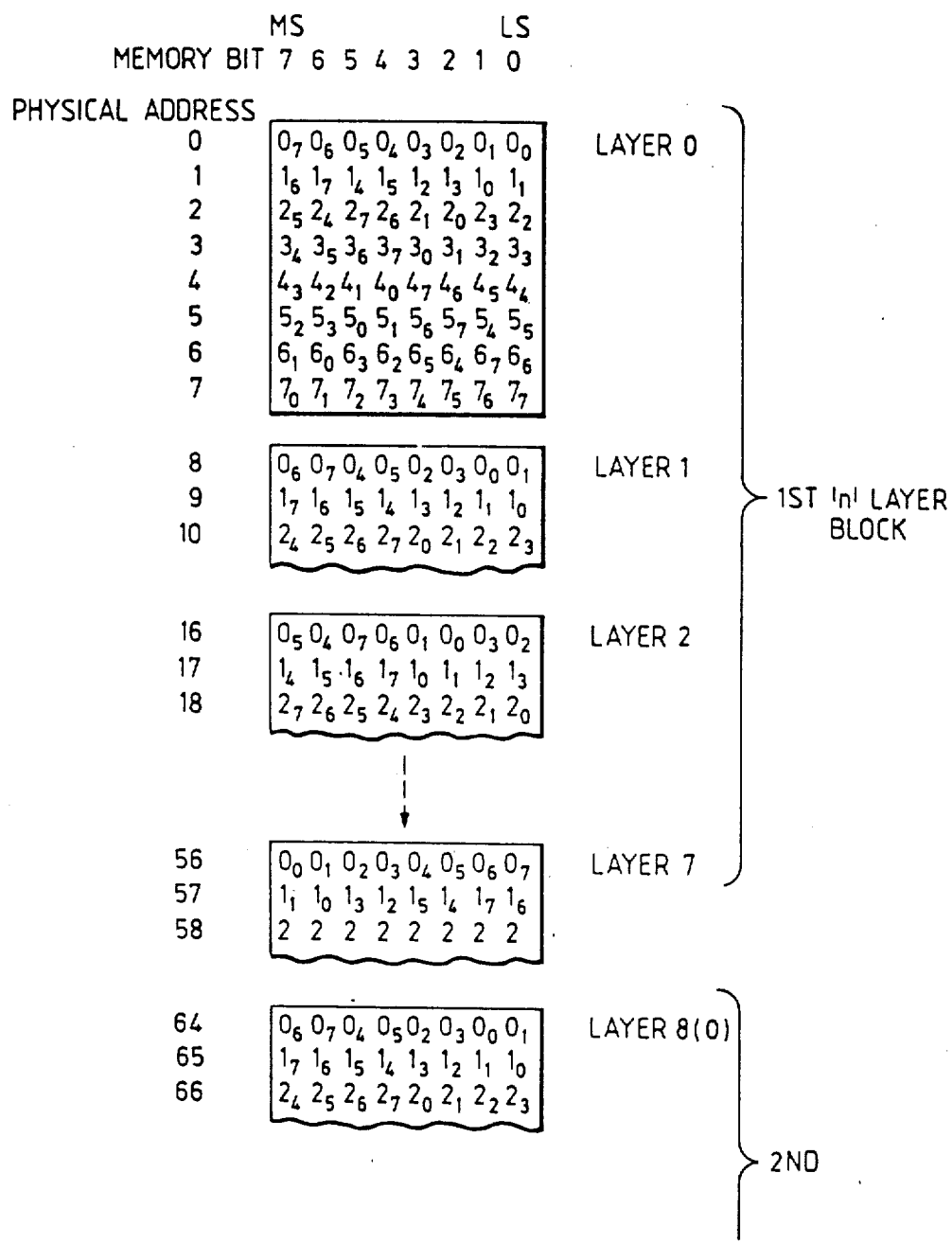
FIG. 12 shows an 8-bit example of a fully multiplexed MDAM data format.

The fully multiplexed format utilizes a simple multiplexing mechanism to achieve data distribution. For each successive word in physical memory, a higher order stage of multiplex shift/flip is introduced, with a further additional stage being introduced at modulo n word boundaries, as depicted in the example of FIG. 12. Thus, for the first word, data is stored normally. For the second word a first multiplex stage is introduced which flips, i.e. interchanges, single word bits $1-0, 3-2, 5-4$ and so on. For word 2 a second stage multiplex is introduced (the first stages reverting to normal) which flips pairs of bits 3&2 with 1&0, 7&6 with 5&4 and so on. For the third word, both first and second stage multiplex is introduced and quadruple groups are 'flipped' or interchanged. Higher order stages flip more bits respectively; the system is only sensible for a $2^a$ bit wide memory, a being integer.

For third-dimensional access, the first word of each successive layer is flipped with an additional stage of multiplex being engaged in a similar manner to the consecutive words of the first layer.

Figure 13:
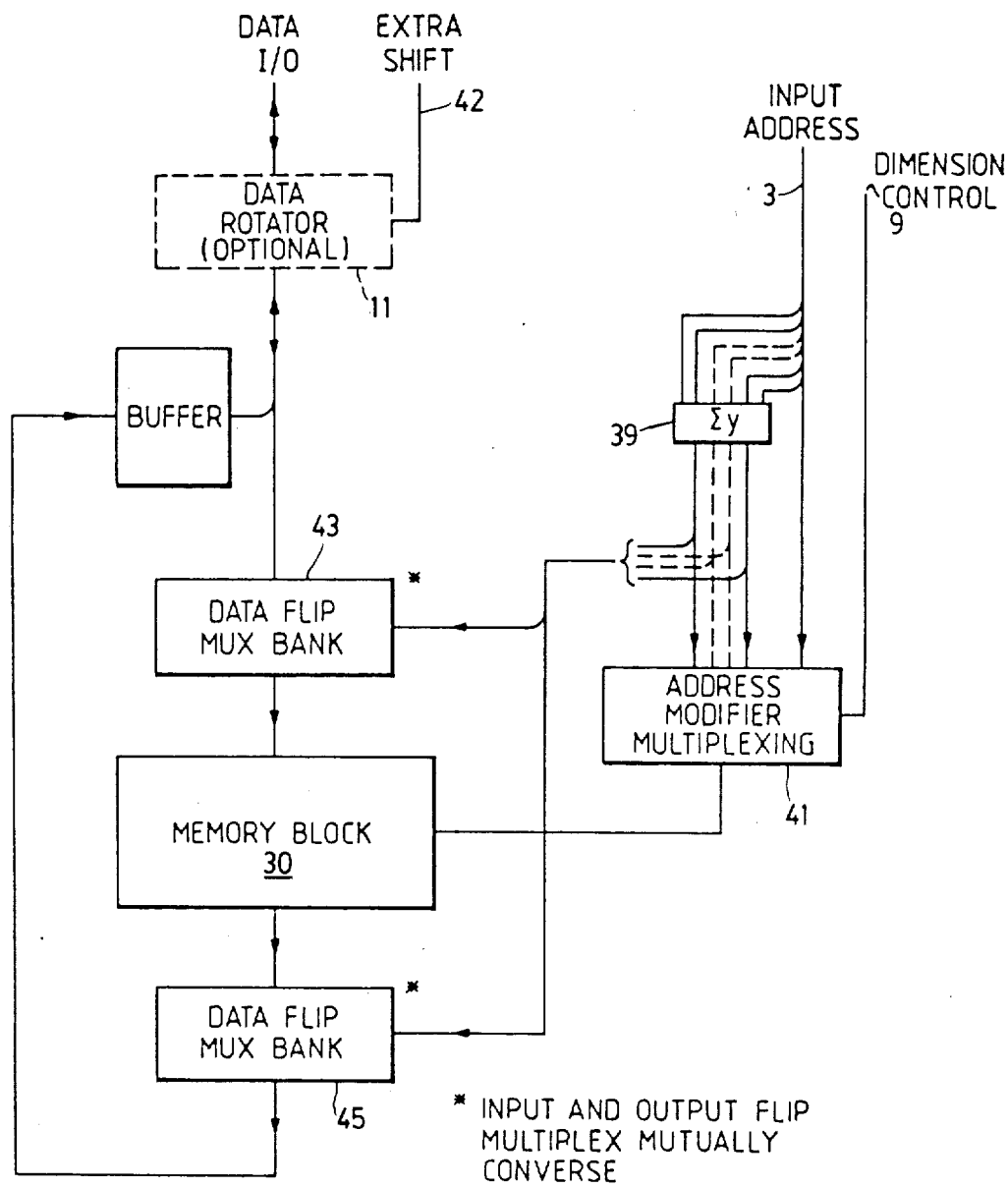
FIG. 13 shows a schematic diagram of an implementation of a full-multiplex-format MDAM.

No data rotation is required with this format. The write multiplexing must be the converse of read multiplexing, however. Additional shift (input 42) must be applied, as shown in FIG. 13, using a completely separate data rotator 11.

For an m dimensional memory of word length n the addressing derivation is again a function of the individual bit summations of multiple address sections, of length log(n), and a fairly simple set of multiplexers driven by the adder outputs, to select true or inverse input addresses. Thus only two lines for each input address need be derived, a considerable saving for large n when compared against the full rotate format.

For first dimensional access all address bits will follow the corresponding input address.

For second-dimension access the LS sub-section of addresses will be modified according to the summation result. If each address is formed into two bits $T_1Ax$ and $T_2Ax$ where $T_1Ax$ is a first term for. Ax, $T_2Ax$ is a second term, then these address bits will be applied to the n memory devices (columns) in a binary alternating pattern.

Thus, $T_1A_0$ is applied to devices 0,2,4,6,8 - - -
$T_2A_2$ is applied to devices 1,3,5,7,9 - - -
$T_1A_1$ is applied to devices 0,1,4,5,8,9 - -
$T_2A_1$ is applied to devices 2,3,6,7,10,11 -
$T_1A_2$ is applied to devices 0,1,2,3,8,9,10,11, - -4,5,6,7,12,13,14,15 - and so on. This pattern repeats for each sub-section of addresses.

The addressing will then be derived such that, for second-dimensional access:

| for | $A_0$ | if | $\Sigma_0 = 0$ | $T_1A_0 = 0$ | $T_2A_0 = 1$ |
|---|---|---|---|---|---|
| | | | $\Sigma_0 = 1$ | $T_1A_0 = 1$ | $T_2A_0 = 0$ |
| | $A_1$ | if | $\Sigma_1 = 0$ | $T_1A_1 = 0$ | $T_2A_1 = 1$ |
| | | | $\Sigma_1 = 1$ | $T_1A_1 = 1$ | $T_2A_1 = 0$ |
| | $A_2$ | if | $\Sigma_2 = 0$ | $T_1A_2 = 0$ | $T_2A_2 = 1$ |
| | | | $\Sigma_2 = 1$ | $T_1A_2 = 1$ | $T_2A_2 = 0$ | and so on.

This pattern is repeated for higher order bits for higher order dimensional access.

Implementation may be achieved with a simple set of one bit adders 39 and a multiplex network, with multiplex networks 43 and 45 for the data film mechanism, for example as shown in FIG. 13.

In an alternative arrangement, the one bit adders 39 may be replaced by simple logic gating in the form of multiple exclusive OR gating or similar, but this will get more complex for a large number of dimensions.

The FIG. 12 arrangement represents only one of several possible multiplex formats; the addressing will remain similar for most variations.

Figure 14:
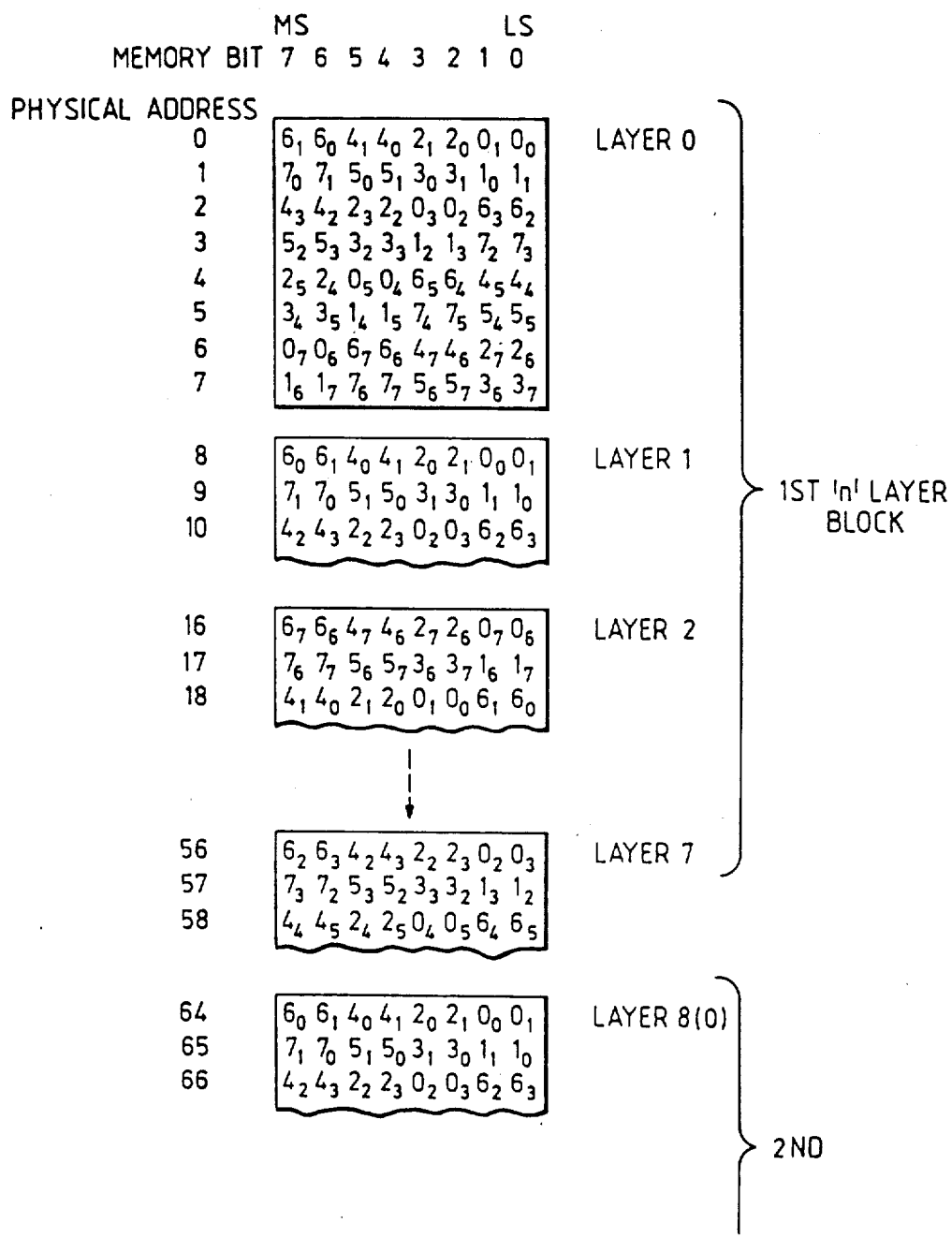
FIG. 14 shows an 8-bit example of a partial rotate-partial multiplex MDAM data format.

The partial multiplex, partial rotate format, an example of which is illustrated in FIG. 14, requires that the total word length n be sub-divided into sections of length $2^a$ e.g. 2, 4 or 8 bits. These sections are then formatted using the multiplex flip technique. The sub-sections are then rotated around the total memory width at intervals of $2^a$ words. This technique allows for partial simplification of the modified address derivation mechanism in conjunction with a minor complication and delay in the data path; it involves a rotator mechanism allowing for the inclusion of the extra shift facility with negligible penalty.

A schematic diagram of a partial rotation/partial multiplex is given in FIG. 15. Again, similar references indicate similar components. The first word is stored normally, the second introduces a first stage flip; the third a second stage flip (first stage flip disabled) and the fourth introduces first and second stage flip multiplexing, and so on up to a limit of $2^a$ words (sub-section length). The next word is then stored with a rotation of $2^a$ and no flip multiplexing; the sequence continues for high order words up to n words.

For third dimensional access and beyond, the first word of each successive layer is stored with the same progressive multiplex/shift pattern as for the first n words, as above.

There is a balance to be struck here between the reduction of address derivation complexity by more multiplexing, and the increase in data flip circuits before input to the rotator (giving extra delay). The rotator has once again become an integral part of the mechanism, thus extra shift (input 42) presents little penalty.

The address derivation is now dependent upon a multi-part summation of address sub-sections using adders 38 and 47. The sub-section multiplex is controlled by a set of individual 1 bit adders 38 operating on respective bits of the sub-section addresses and multiplex networks 43, 44 and 45. The higher order/rotation addressing is controlled by a full summation 47 term of the remaining bits of the sub-section addresses and multiplex stages.

Thus for a 16 bit example, the word length may be sub-divided into 4 sub-sections of 4 bits requiring 2 bits of each address sub-section for the multiplex control 43, 44 and 45 leaving two bits to control the rotate and higher order addressing in multiples of four by way of summation 47. Thus two one bit adders operate on $A_0+A_4+A_8+$ --- and $A_1+A_5+A_9+$ --- and a full two bit adder operates on $A_{3,2}+A_{7,6}+A_{11,10}+$ ---.

The LS bit derivations are then performed according to dimensional access and one bit summations $\Sigma_0$ and $\Sigma_1$, etc using the pattern indicated on the full multiplex mode. The remaining bits of each sub-section are modified using the rotating patterns indicated in the rotating mode (the first remaining bit adopting the pattern detailed for the LS address of that mode, and so on).

For some combinations of n and a, the word length and the sub-section length, the remaining bit modifications may also become a fairly simple multiplex derivation. For instance the whole of a 16 bit 3-D derivation using 4 bit sub-sections can be done with a simple set of adders, and a bank of 2 and 4 bit multiplexers.

The total number of address lines will be $$\left[ (2 \log a) + \sum_{x=1}^{l} 2^x \right]$$

per address sub-section,
where $l = \log(n) - \log(a)$

For example for a 16 bit sub-section length 4 memory, each sub-section modification will require $[2^2+2+4]=10$ lines. For 3D operation this requires 20 lines, which is not a great penalty when compared against the full multiplex (16 lines), and allows extra shift facilities directly with only a minimal flip-move delay added to the data path.

The data flip multiplexer will be controlled by $\Sigma_1$ and $\Sigma_0$ directly, the data rotator will be controlled by $4 \times \Sigma_{3,2}$ in the 16 sub 4 example.

We claim:

1. A data memory arrangement comprising:

(I)(a) $n^d$ storage elements in rows and columns, each of said rows comprising n of said storage elements and each of said columns comprising $n^{d-1}$ of said storage elements,
  (b) means for addressing each of said columns one said storage element at a time,
  (c) said d being a dimension integer greater than two so that said arrangement comprises $n^{d-2}$ square arrays of said storage elements,
  (d) each of said square arrays comprising square sub-sections arranged in $n/2^a$ sub-section rows and $n/2^a$ sub-section columns,
  (e) each of said square sub-sections comprising $2^{2a}$ storage elements in $2^a$ rows and $2^a$ columns, a being an integer,
(II) data multiplexing and rotation means for rearranging a data array of $n^{d-1}$ rows of data bits and n columns of data bits for storage in said memory arrangement—the rearrangement being such that
  (a) throughout each n square arrays of said memory arrangement the storage of data in said sub-sections varies from one square array to the next by multiplex changes within each said sub-section through a multiplex cycle extending over a group of $2^a$ square arrays,
  (b) and after each said group of $2^a$ square arrays by a rotation imposed upon the next said group, said rotation being of all the sub-sections within their respective said square arrays, said rotation being cyclic and progressive from one said group to the next said group,
  (c) and further such that after n of said square arrays a said rotation is effected without a multiplex change.

2. A data memory arrangement according to claim 1 wherein said data multiplexing and rotation means comprises means for storing a first square array of data in a first of said square arrays of storage elements and rearranging said data by multiplexing data bits within each of said sub-section rows, according to a multiplex cycle extending progressively over the $2^a$ rows of each said sub-section, multiplexing said sub-section rows within said first square array according to a multiplex cycle extending progressively over the $n/2^a$ sub-section rows of said first square array, rotating said sub-section-rows horizontally and progressively, and rotating said sub-section columns vertically and progressively.

3. A memory arrangement according to claim 1, further comprising means for applying a rotation control signal to said rotation means for imposing a further rotation on the address of any accessed word.

4. A memory arrangement according to claim 1, further comprising address modification means responsive to a boundary shift control signal for modifying the address of a data word in a dimension (d−1) and accessing a data word which extends across a boundary between adjacent $n^{d-1}$ arrays in an $n^d$ data array.

5. A memory arrangement according to claim 1, further comprising addressing means for addressing locations in individual columns of a said square array, said addressing means comprising logic circuitry means for storing bit location address codes for application to respective columns in parallel and for cycling said codes into correspondence with said columns in dependence upon the word to be accessed.

6. A method of storing a rectangular data array in a corresponding rectangular array of storage elements to permit simultaneous access to data elements in the same column of said data array, said array of storage elements comprising $n^{d-2}$ square arrays, where d is a dimension integer greater than 2, each of said square arrays comprising $n^2$ storage elements arranged in rows and columns, and each of said square arrays comprising square sub-sections each of $2^{2a}$ storage elements, a being an integer multiplexing the data elements said method comprising the steps of:

(I) receiving a first square array of $n^2$ data elements of said data array;

(II) rearranging said first square array of data elements by:
   (a) multiplexing the data elements of each row progressively through the rows of each of square sub-sections of said first square array of data elements;
   (b) subjecting said rows of sub-sections to a multiplexing cycle;
   (c) rotating said rows of sub-sections in the row direction progressively from row to row;
   (d) rotating columns of said sub-sections in the column direction progressively from column to column;

(III) storing said first square array of data elements so rearranged in a first square array of said storage elements;

(IV) rearranging successive ones of said square arrays of data elements by:
   (a) subjecting sub-sections of data elements in successive said square arrays of data elements to respective steps of a multiplex cycle;
   (b) rotating said rows of sub-sections of data elements in the row direction by one sub-section after each said multiplex cycle;
   (c) rotating said columns of sub-sections of data elements in the column direction by one sub-section after each said multiplex cycle; and (V) storing the successive ones of said square arrays of data elements so rearranged in successive respective ones of said square arrays of said storage elements.

* * * * *

UNITED STATES PATENT AND TRADEMARK OFFICE
CERTIFICATE OF CORRECTION

PATENT NO. : 4,667,308
DATED : May 19, 1987
INVENTOR(S) : David Hayes; Francis E. Rix It is certified that error appears in the above-identified patent and that said Letters Patent are hereby corrected as shown below:

In column 1 of the cover page, under the heading "Foreign Application Priority Data":

the date "Jul. 21, 1983" should read
--Jul. 21, 1982--;

and the Ser. No. "8319704" should read --8221130--.

Signed and Sealed this

Twenty-third Day of February, 1988

*Attest:*

DONALD J. QUIGG

*Attesting Officer*   *Commissioner of Patents and Trademarks*